US012775057B2

(12) United States Patent
Vernickel et al.

(10) Patent No.: US 12,775,057 B2
(45) Date of Patent: Oct. 27, 2026

(54) TUNABLE RADIO FREQUENCY RECEIVER COIL

(71) Applicant: KONINKLIJKE PHILIPS N.V., Eindhoven (NL)

(72) Inventors: Peter Vernickel, Hamburg (DE); Christopher Günther Leussler, Hamburg (DE); Christian Findeklee, Hamburg (DE)

(73) Assignee: Koninklijke Philips N.V., Eindhoven (NL)

(*) Notice: Subject to any disclaimer, the term of this patent is extended or adjusted under 35 U.S.C. 154(b) by 175 days.

(21) Appl. No.: 18/859,193

(22) PCT Filed: Apr. 14, 2023

(86) PCT No.: PCT/EP2023/059759
§ 371 (c)(1),
(2) Date: Oct. 23, 2024

(87) PCT Pub. No.: WO2023/208610
PCT Pub. Date: Nov. 2, 2023

(65) Prior Publication Data

US 2025/0258258 A1 Aug. 14, 2025

(30) Foreign Application Priority Data

Apr. 25, 2022 (EP) .................................... 22169741

(51) Int. Cl.
*G01R 31/36* (2020.01)
*G01R 33/28* (2006.01)
*G01R 33/36* (2006.01)

(52) U.S. Cl.
CPC ....... *G01R 33/3657* (2013.01); *G01R 33/288* (2013.01)

(58) Field of Classification Search
CPC .......................... G01R 33/288; G01R 33/3657
See application file for complete search history.

(56) References Cited

U.S. PATENT DOCUMENTS

2002/0180437 A1 12/2002 Reykowski et al.
2010/0102817 A1* 4/2010 Saha .................... G01R 33/422 324/318

(Continued)

OTHER PUBLICATIONS

International Search Report and Written Opinion from PCT/EP2023/059759 dated Jun. 23, 2023.

*Primary Examiner* — Tung X Nguyen

(57) ABSTRACT

For detecting an error of a magnetic resonance examination system, a tunable radio frequency RF receiver coil assembly is provided The RF receiver coil assembly comprises at least one RF receiver coil (1), an electronic de-/tune circuit (2) for switching between a low noise reception state of the tunable RF receiver coil (1) and a passive state of the tunable RF receiver coil (1), and a monitor circuit (7). The monitor circuit (7) is electrically insulated from and reactively coupled to the electronic de-/tune circuit (2) and is adapted to inductively measure the AC electrical current or AC voltage in the electronic de-/tune circuit (2) induced by a RF transmit signal generated by the magnetic resonance examination system or the monitor circuit (7) is adapted to couple an RF signal into the tunable RF receiver coil (1) wherein the tunable RF receiver coil (1) is arranged to receive the coupled RF signal by a magnetic resonance preamplifier (12). For correlating the inductively measured electrical current in the electronic de-/tune circuit (2) or the coupled RF signal received by the magnetic resonance preamplifier (12) to the RF transmit operational status of a RF transmit pulse envelope for the RF transmit signal generated by the magnetic resonance examination system the RF receiver coil assembly comprises a correlator device (10), wherein the (Continued)

correlator device (10) is connected to the monitor circuit. Further a magnetic resonance examination system and a method for detecting an error of a magnetic resonance examination system is provided.

16 Claims, 3 Drawing Sheets

(56) References Cited

U.S. PATENT DOCUMENTS

| | | | | |
|---|---|---|---|---|
| 2017/0205481 | A1 | 7/2017 | Kim et al. | |
| 2020/0191890 | A1* | 6/2020 | Nistler | G01R 33/3692 |
| 2021/0088608 | A1 | 3/2021 | Biber | |
| 2021/0190890 | A1 | 6/2021 | Biber et al. | |

* cited by examiner (State of the art)

TUNABLE RADIO FREQUENCY RECEIVER COIL

CROSS REFERENCE TO RELATED APPLICATIONS

This application is a U.S. national phase application of International Application No. PCT/EP2023/059759 filed on Apr. 14, 2023, which claims the benefit of EP Application Serial No. 22169741.0 filed on Apr. 25, 2022 and is incorporated herein by reference.

FIELD OF THE INVENTION

The invention relates to the field of tunable radio frequency (RF) receiver coil assemblies, and in particular to a system and a method for detecting an error of a magnetic resonance examination system with tunable radio frequency (RF) receiver coils.

BACKGROUND OF THE INVENTION

MR devices apply a main magnetic field through an examination region during the examination and/or treatment of patients. This strong field, typically denoted $B_0$, acts to align the nuclear spins of the body tissue within a patient to be examined. In some MR devices, the $B_0$ field is horizontally oriented, and in others it is vertically oriented.

In both horizontally and vertically oriented systems, magnetic resonance is excited in the aligned nuclear spins by a relatively strong orthogonal radio frequency (RF) field, typically denoted $B_i$. The $B_i$ field causes the aligned nuclear spins to tip into a plane orthogonal to the static magnetic field $B_0$. The spins precess back into alignment with the $B_0$ field emitting relatively weak RF magnetic resonance signals as the nuclear spins relax. This resonance is detected by RF coils tuned to the specific resonance frequency. These resonance signals are passed to processing equipment to reconstruct the signals into an image representation or derive spectroscopy information. Typically, the transmitted RF magnetic excitation signals are orders of magnitude larger than the received magnetic resonance signals generated by the relaxing nuclear spins detected by the RF receive coils.

MR coils for signal reception need to have two operational states. An "on" state or more precisely a low noise reception state for capturing of very weak (down to noise floor) nuclei signals and an "off" state or more precisely a passive state of the tunable RF receiver coil, in which the coils need to withstand strong RF pulses intended to excite nuclei. Besides other means, the two states are achieved by placing one or more detune switches along the coil conductors. Impedance transformation and transmission lines might be employed so that the actual switches can be placed at the same spot while they get effective at remote locations. Currently, the switch consists of a diode which is biased accordingly. Diodes available are far away from being an ideal switch exhibiting a non-zero forward-biased impedance and a non-infinite impedance when reverse biased. For MR, this issue is typically solved by adding a parallel resonant circuit as switch in series to the coil.

To maintain patient safety and to protect the sensitive receiver equipment, the receive coils are typically decoupled or detuned during the transmit phase of the MR procedure. To minimize the above-mentioned problems, the coils contain a specific detuning circuit, whose function is to keep the receiver equipment from receiving the transmitted RF excitation signals. Accordingly, it is known to decouple MRI coils using PIN diodes in the detune circuit.

Current detune circuits for MR receive coils use PIN diodes to switch between the receive coils between tuned and detuned states. PIN diodes are semiconductor devices that can be operated as a DC current/voltage-controlled RF switch. When forward biased with a DC current, the PIN diode acts like a closed switch with low on-resistance. When reverse biased with a DC voltage, the PIN diode acts like an open switch with high off-resistance and low parasitic capacitance. Since the forward bias uses a DC current, forward biasing requires a non-negligible amount of power.

In MRI receive coils, the PIN diode is used in a resonant tank circuit configuration, so that the MRI receive coil is detuned whenever the PIN diode is forward bias, i.e., the RF switch is "on". This configuration is preferred for MRI receive coils because the DC drive signals can be kept low. In addition, the tank circuit configuration also permits generation of part of the forward DC bias current from the RF excitation currents through the diode. If on the other hand the PIN diode is placed directly into the antenna structure, the diode is reverse biased during transmit. The reverse bias DC voltage has to exceed the RF voltage, which could be in the order of several hundred volts. Such a configuration also requires a relatively high forward DC current (~100 mA) during receive in order to keep the losses low.

FIG. 1 schematically depicts a tunable radio frequency (RF) receiver coil assembly according to the state of the art. The RF receiver coil assembly comprises a RF receiver coil 1 and an electronic de-/tune circuit 2 for switching between the "on" and the "off" state. The tank circuit 3 consists of a capacitor 4 and an inductance 5. As switch 6 a PIN diode is used. In the "on" state, the diode 6 is reverse biased, disabling the inductance 5 of the parallel resonant circuit. RF currents (induced from signals of the nuclei) can freely circulate in the coil loop. Mostly the/one of the capacitors forming the resonant circuit of the MR coil is double used for that detune circuitry. Being forward biased, the diode 6 enables the inductance 5 forming a parallel resonant circuit together with that resonance capacitor 4. This provides a high blocking impedance, much higher than that of the reverse biased diode itself. The functioning of that circuit is detected by measuring the bias current though the diode 6 continuously. When the two expected values for the low noise reception state and the passive state (zero and e.g., 80 mA) are not reached a stop of the scan is triggered. RF currents (induced by the RF transmit pulse) are effectively blocked in the coil loop.

Measurement of the diode 6 current is an indirect indicator for proper functioning but requiring additional means for safety. The reason is that in the failure mode where the diode 6 gets disconnected from the rest of the coil 1 is not detectable. The situation is not changed when including the inductance 5 into the bias loop 9. Due to this uncertainty, a fuse may be added along the MR coil 1. The fuse blows when the current reaches a certain threshold, which is considered as being hazardous for the patient. However also this method has drawbacks. The fuse is basically a resistor which heats up (and gets destroyed) by a surging current. The resistor adds to the thermal noise received by the preamp and with this worsens the signal to noise ratio (SNR). For small coils placed close to the patient, the threshold for the currents is in the order of magnitude where no fuses are available which blow quick enough and are still acceptable with respect to their impact on SNR. Monitoring the function of the tank circuit 3 as a whole is the only fail-safe detection method: if the tank circuit 3 gets disconnected, the coil 1 is broken, but inherently safe. The broken MR coil 1 will be detected since it provides no MRI receive signal anymore.

The US patent application US2021/0190890 discloses a local coil with an active and passive de-/tuning facility. A local coil monitoring is provided for the de-/tuning facility. A current sensor is looped into the signal line of the local coil activation.

SUMMARY OF THE INVENTION

It is an object of the invention to improve the safety of the RF transmission into the examination zone of a magnetic resonance examination system.

According to the invention, this object is addressed by the subject matter of the independent claims. Preferred embodiments of the invention are described in the sub claims.

Therefore, according to the invention, a tunable radio frequency RF receiver coil assembly for use in a magnetic resonance examination system is provided the tunable RF receiver coil assembly comprising, at least one RF receiver coil, an electronic de-/tune circuit for switching between a low noise reception state of the tunable RF receiver coil and a passive state of the tunable RF receiver coil, a monitor circuit, wherein the monitor circuit is electrically insulated from and reactively coupled to the electronic de-/tune circuit, the monitor circuit being adapted to inductively measure the electrical AC current or AC voltage in the electronic de-/tune circuit induced by a RF transmit signal generated by the magnetic resonance examination system or the monitor circuit being adapted to couple an RF signal into the tunable RF receiver coil wherein the tunable RF receiver coil is arranged to receive the coupled RF signal by a magnetic resonance preamplifier, or the monitor circuit is configured as transceiver and being adapted to couple an RF signal into the tunable RF receiver coil and to measure a reflection coefficient of the RF signal coupled into the tunable RF receiver coil, the RF receiver coil assembly further comprising a correlator device, wherein the correlator device is connected to the monitor circuit and is arranged to correlate the inductively measured electrical current in the electronic de-/tune circuit to the RF transmit operational status of an RF transmit pulse envelope for the RF transmit signal generated by the magnetic resonance examination system or the correlator device is arranged to correlate the coupled RF signal received by the magnetic resonance preamplifier to the RF transmit operational status of a RF transmit pulse envelope for the RF transmit signal generated by the magnetic resonance examination system.

In an embodiment the correlator device is configured to correlate the inductively measured electrical current in the electronic de-/tune circuit and the coupled RF signal received by the magnetic resonance preamplifier to the RF transmit operational status of an RF transmit pulse envelope for the RF transmit signal generated by the magnetic resonance examination system independently.

For example, if the operational status is correlated with the inductively measured AC electrical current or AC voltage in the electronic de-/tune circuit a certain level of signal coming in is expected. If the operational status is correlated with the coupled RF signal received by the magnetic resonance preamplifier another signal level is expected. Only when both signals are within an expectation the coil is ok, otherwise the deviation pattern helps to track faults in the magnetic resonance examination system. In an advantageous embodiment of the invention the electronic de-/tune circuit comprises a tank circuit with at least a first inductance, the monitor circuit comprising at least a second inductance, wherein the monitor circuit is arranged to weakly couple with the second inductance to the first inductance for picking up a fraction of the current induced by the RF transmit signal wherein the monitor circuit is further arranged to produce a signal in dependence on the RF transmit signal or the monitor circuit is arranged to weakly couple with the second inductance to the tunable RF receiver coil for coupling the RF signal into the tunable RF receiver coil.

In an advantageous embodiment of the invention wherein the monitor circuit further comprising a detector device, wherein the detector device is arranged to rectify or directly sample the signal dependent from the RF transmit signal.

In an advantageous embodiment of the invention the detector device is part of a control logic of the tunable RF receiver coil.

In an advantageous embodiment of the invention the detector device is integrated into the magnetic resonance preamplifier of the tunable radio frequency RF receiver coil.

In an advantageous embodiment of the invention the electronic de-/tune circuit comprises at least one switch for switching between the low noise reception state of the tunable RF receiver coil and the passive state of the tunable RF receiver coil, wherein the switch is a field-effect transistor and/or MEMS switch. Traditional detuning circuits employ a PIN diode switch: however. PIN diodes require a continuous control signal which may cause field distortions along the control signal transmission line unless it is properly shielded. Accordingly, at higher power transmit RF excitation pulses an increasingly higher control signal to bias the PIN diode is required to ensure the coil segment remains decoupled. Therefore, the use of a FET and/or a MEMS switch is particularly advantageous.

In an advantageous embodiment of the invention the correlator device is further configured to distinguish between different signal levels, wherein the different signal levels describe the respective functional state of at least one of the electronic de-/tune circuits.

In accordance with one aspect, a magnetic resonance imaging system comprising a tunable radio frequency RF receiver coil assembly as described above is provided.

In accordance with another aspect, a method for detecting an error of a magnetic resonance examination system is provided the magnetic resonance examination system comprising a tunable radio frequency RF receiver coil assembly the tunable RF receiver coil assembly comprising, at least one RF receiver coil, an electronic de-/tune circuit for switching between a low noise reception state of the tunable RF receiver coil and a passive state of the tunable RF receiver coil, a monitor circuit, wherein the monitor circuit is electrically insulated from and reactively coupled to the electronic de-/tune circuit, the monitor circuit being adapted to inductively measure the AC electrical current or AC voltage in the electronic de-/tune circuit induced by an RF transmit signal generated by the magnetic resonance examination system, a correlator device, wherein the correlator device is arranged to correlate the inductively measured electrical current in the electronic de-/tune circuit to the RF transmit operational status of a RF transmit pulse envelope for the RF transmit signal generated by the magnetic resonance examination system, the method comprising the following steps:

monitoring the electrical current in the electronic de-/tune circuit induced by a RF transmit signal generated by the magnetic resonance examination system by the monitor circuit, correlating the inductively measured electrical current in the electronic de-/tune circuit to the RF transmit operational status of a RF transmit pulse envelope for the RF transmit signal generated by the magnetic resonance examination system with the correlator device, determining whether the electronic de-/tune circuit is in abnormal state based on the RF transmit operational status of a RF transmit pulse envelope for the RF transmit signal.

In an advantageous embodiment of the invention the method comprises the following additional step:

mapping a position of the tunable RF receiver coil based on the monitored electrical current in the electronic de-/tune circuit.

In an advantageous embodiment of the invention the step of mapping a position of the tunable RF receiver coil comprises the step of using deterministic matrix operations or AI techniques.

In accordance with another aspect, a method for detecting an error of a magnetic resonance examination system is provided the magnetic resonance examination system comprising a tunable radio frequency RF receiver coil assembly the tunable RF receiver coil assembly comprising, at least one RF receiver coil, an electronic de-/tune circuit for switching between a low noise reception state of the tunable RF receiver coil and a passive state of the tunable RF receiver coil, a monitor circuit, wherein the monitor circuit is electrically insulated from and reactively coupled to the electronic de-/tune circuit, the monitor circuit being adapted to couple an RF signal into the tunable RF receiver coil wherein the tunable RF receiver coil is arranged to receive the coupled RF signal by a magnetic resonance MR preamplifier, the tunable RF receiver coil assembly further comprising a correlator device, the correlator device is arranged to correlate the coupled RF signal received by the magnetic resonance preamplifier to the RF transmit operational status of a RF transmit pulse envelope for the RF transmit signal generated by the magnetic resonance examination system the method comprising the following steps:

coupling an RF signal into the tunable RF receiver coil by the monitor circuit, receiving the RF signal by the MR preamplifier, correlating the received RF signal in the MR preamplifier to the RF transmit operational status of a RF transmit pulse envelope for the RF transmit signal generated by the magnetic resonance examination system with the correlator device, determining whether the electronic de-/tune circuit is in abnormal state.

In an advantageous embodiment of the invention the step of coupling an RF signal into the tunable RF receiver coil by the monitor circuit is interleaved with a magnetic resonance sequence.

In an advantageous embodiment of the invention the step of coupling an RF signal into the tunable RF receiver coil by the monitor circuit is interleaved with a magnetic resonance sequence is combined with a pilot tone technique using an RF signal close to the Larmor frequency.

In accordance with one aspect, a computer program product is provided comprising instructions for detecting an error of a magnetic resonance examination system by controlling a tunable radio frequency RF receiver coil assembly according to the methods as described above.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
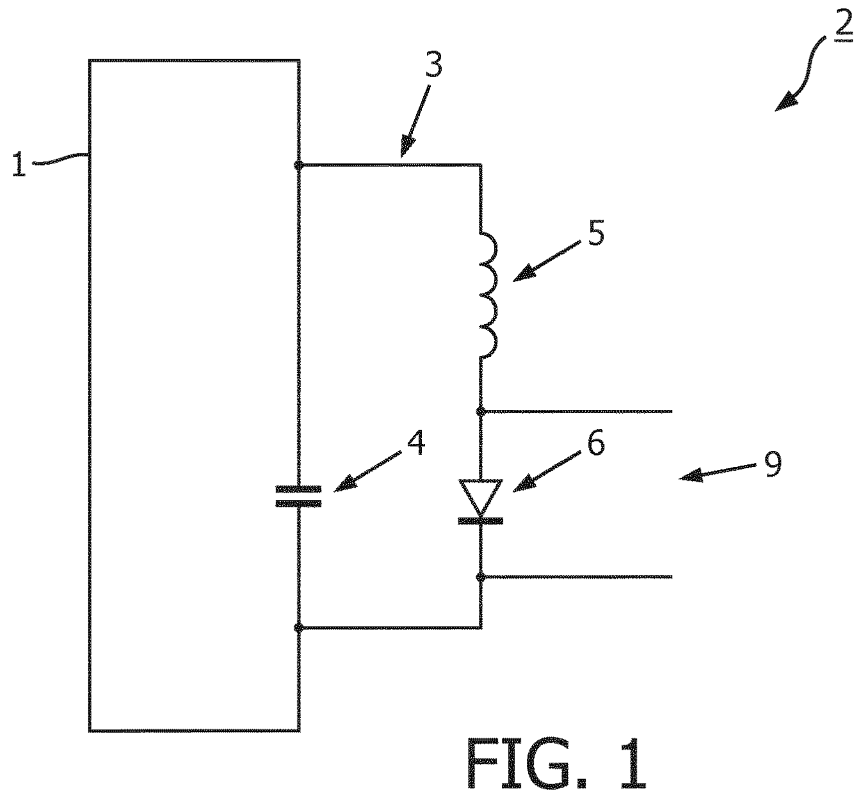
FIG. 1 schematically depicts a tunable radio frequency receiver coil assembly according to the state of the art, FIG. 2 schematically depicts a tunable radio frequency receiver coil assembly according to an embodiment of the invention.

FIG. 1 has already been described as prior art in the general part of the description.

Figure 2:
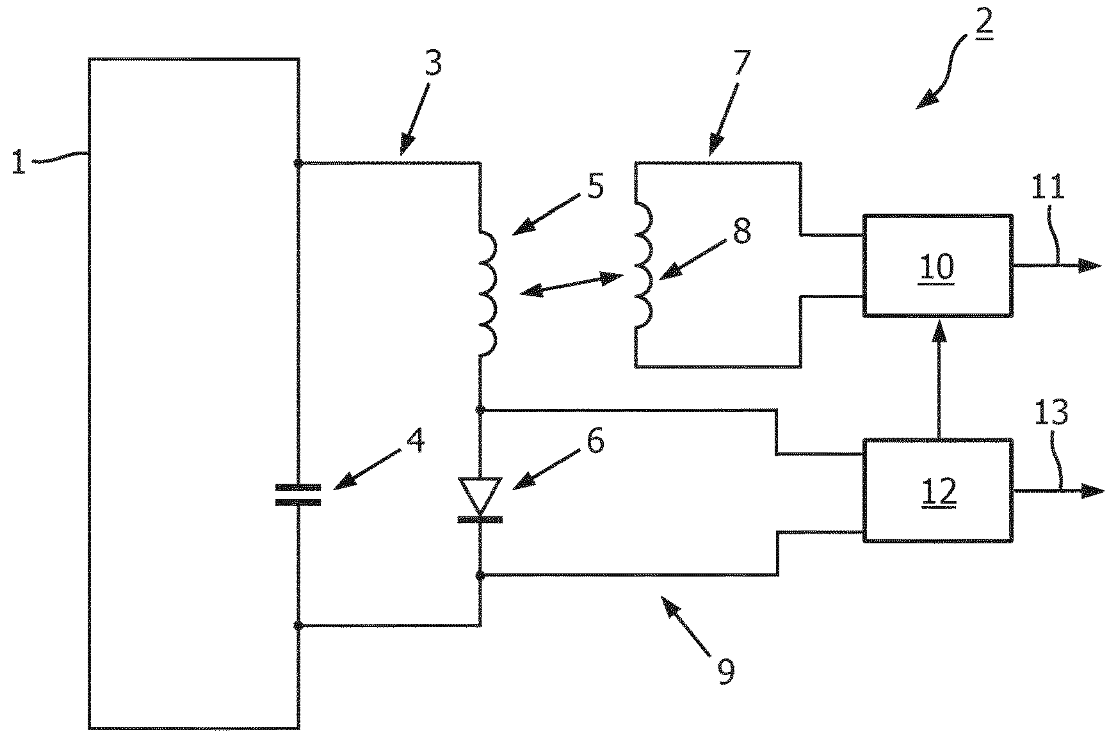

FIG. 2 schematically depicts a tunable radio frequency receiver coil assembly according to an embodiment of the invention. The RF receiver coil assembly comprises a RF receiver coil 1 and an electronic de-/tune circuit 2 for switching between a low noise reception state of the tunable RF receiver coil 1 and a passive state of the tunable RF receiver coil 1. The RF receiver coil assembly has further a monitor circuit 7, wherein the monitor circuit 7 is electrically insulated from and reactively coupled to the electronic de-/tune circuit 2. On the one hand the monitor circuit 7 is adapted to inductively measure the AC electrical current or AC voltage in the electronic de-/tune circuit 2 induced by a RF transmit signal generated by the magnetic resonance examination system or on the other hand to couple an RF signal into the tunable RF receiver coil 1 wherein the tunable RF receiver coil 1 is arranged to receive the coupled RF signal by a magnetic resonance preamplifier 12. In practice the monitor circuit 7 inductively measures the AC current or voltage in the electronic de-/tune circuit in the radio frequency Larmor frequency band associated with the spin resonance frequency for the type of nucleus and the main field strength. In another embodiment the monitor circuit 7 is configured as transceiver and being adapted to couple an RF signal into the tunable RF receiver coil 1 and to measure a reflection coefficient of the RF signal coupled into the tunable RF receiver coil 1. Based on a measurement of the reflection coefficient, a simple binary decision can be made whether the RF receiver coil 1 is still working or not. In an embodiment of the invention the electronic de-/tune circuit 2 comprises a tank circuit 3 with at least a first inductance 5, the monitor circuit 7 comprising at least a second inductance 8, wherein the monitor circuit 7 is arranged to weakly couple with the second inductance 8 to the first inductance 5 for picking up a fraction of the current induced by the RF transmit signal wherein the monitor circuit 7 is further arranged to produce a signal in dependence on the RF transmit signal. In an embodiment the monitor circuit 7 comprises a detector device. The detector device is arranged to rectify or directly sample the RF transmit signal dependent signal. The detector device can be e.g., part of a control logic of the tunable RF receiver coil. As switch 6 for switching between a low noise reception state of the tunable RF receiver coil 1 and a passive state of the tunable RF receiver coil 1 a PIN diode is used in the electronic de-/tune circuit 2. In the "on" state, the diode 6 is reverse biased, disabling the inductance 5 of the parallel resonant circuit. RF currents (induced from signals of the nuclei) can freely circulate in the coil loop. Mostly the/one of the capacitors 4 forming the resonant circuit of the MR coil 1 is double used for that detune circuitry. Being forward biased, the diode 6 enables the inductor forming a parallel resonant circuit 3 together with that resonance capacitor 4. This provides a high blocking impedance, much higher than that of the reverse biased diode 6 itself. However, PIN diodes require a continuous control signal which may cause field distortions along the control signal transmission line unless it is properly shielded. Accordingly, at higher power transmit RF excitation pulses an increasingly higher control signal to bias the PIN diode 6 is required to ensure the coil segment remains decoupled. Therefore, the use of a FET as switch 6 is particularly advantageous. Diodes might be replaced by FETs in the near future removing the option for a current source-based switching. This would also remove the option for current based malfunction testing. It would require an extra DC connection to monitor the integrity of the drain source (DS) trace of the FET, still exhibiting the same issues as the diode monitoring. Therefore, the invention is particularly advantageous when FETs as switches 6 are used. In an embodiment of the invention the RF current is measured in the tank circuit 3. A high voltage induced in the RF receiver coil 1 (by the transmit pulse) leads to a high current in the inductance 5. $I_{L1}=I_{MRcoil}*Q$ with Q the Q-factor of the tank circuit 3 and $I_{MRcoil}$ the small residual current in the detuned receive loop. The measurement is done by using an inductance 8 weakly coupling to the inductance 5 thus picking up a fraction of the current induced by the transmit field. The signal picked up by inductor 8 is then rectified or directly sampled using a detector device being part of the control logic of the coil 1. The data is transmitted to the logic via data lines 11, 13. The demands with respect to the dynamic range and the bandwidth, are for this detector are way lower than those for the receiver used to detect the spin signals. In an embodiment this functionality is part of a magnetic resonance preamplifier 12 of the RF receiver coil 1. The magnitude of the signal should reach a certain threshold value and should follow the transmit pulse envelope. If this is not the case, the tank circuit is broken (or the coil which is a safe situation anyway, e.g., orientated such that it hardly catches any flux of the transmit field.) The indirect detection method via the tank circuit 3 instead of directly coupling to the RF receiver coil prevents that noise or other disadvantageous effects couple from inductor 8 and the connected electronics to the magnetic resonance preamplifier 12.

Typically. RF receiver coil assemblies have multiple tank circuits 3 respectively detune circuits 2. A straightforward approach is to monitor each and every circuit but that may lead to other issues e.g., more wires, components etc. In addition to the monitoring of several coils of an array in an embodiment of the invention it is proposed to make the monitoring of a single tank circuit more complex. This can be the tank circuit 3 closest to the preamplifier 12 for example. When one de-/tune circuit 2 fails, that leads to a higher voltage drop over the others. So, in an embodiment of the invention the correlator device 10 is configured to distinguish between different signal levels. For example, the different levels can be the following: Nearly no signal is coupled out of the tank circuit 3 during the transmit phase. This means that the directly linked tank circuit 3 is broken, which leads to a malfunction and an interlock. If a certain demand signal level is reached, it means that all tank circuits 3 are in order and there is no malfunction. If the signal level higher than the demand signal level, it means that the remote tank circuit 3 of a coil 1 is broken which leads to a malfunction and an interlock. In an embodiment of the invention a transmit signal magnitude, a phase and the coil position could serve as input for decision making by the tank circuit 3. Accordingly, the RF receiver coil 1 is set up in such a way that the information about a malfunction is feed towards the front-end, in particular to the receiver coil 1.

Typically, the inductance 5 is aligned in a way that it produces a magnetic field perpendicular to that of the RF receiver coil 1, so that in normal situations does not couple to the MR TX and RX fields. As a consequence, when the RF receiver coil 1 is wrongly aligned, the inductance 8 effectively couples to the TX field leading to a detectable signal (indicating functioning of the tank circuit). For certain coils like flexible surface arrays, this might still lead to false malfunction detections. In an embodiment of the invention the method is changed: Instead of picking up a signal via inductance 8, an RF signal is coupled via inductance 8 into the coil and received by the MR preamplifier 12. Also here, typical magnitudes or signal envelopes should be detected, otherwise the coil 1 is malfunctioning. In this scenario the coil integrity test is interleaved with the MR sequence. This can be combined with a pilot tone technique using a RF signal close but not at the Larmor frequency. Typically, arrays of many coils 1 must be monitored. By considering the measurement results of all coil elements, one can estimate the positions of the coil 1 within the scanner, so that false positive results are prevented. This may involve calibration measurement of the coil 1 (or at least the coil type in the factory). A mapping technique that estimates the current position based on the actual measurements (signals at inductance 8) and the calibration results may be implemented using deterministic matrix operations or AI techniques. The detection methods magnitude, envelope, complex signal (magnitude & phase), sensing or transmitting via inductance 8 and the coil neighbor consideration vary in complexity and consequences for the MR sequence The selection of the proper technique is coil dependent. The position of the coil 1 can be monitored during an imaging sequence. In case of misalignment, the coil 1 can be repositioned, or measures can be taken to correct calibration scan for sense imaging. The complex signal is used to train an AI learning algorithm to get a baseline for the complex signal monitor. Only if the complex RF current is within a defined parameter window, the scan is activated or continued. Before the scan starts, a preparation pulse can be used to monitor the fitness of the detuning state. The RF current in the coil 1 depends on the Q factor of the coil and is an indicator for coil patient fitting. Additionally, the temperature of the detuning circuit can be calculated T (coil i)=f (Q, duty cycle, amplitude, phase, fitting parameter). In an embodiment a software monitor on the operator console can show up state of detuning circuit including reporting, history for data mining and as diagnostic service tool. In addition, the complex magnitude of RF current in the coil is a measure of local $B_1$ field inhomogeneity, thus allowing for correction of overall $B_1$ field in the image reconstruction.

Figure 3:
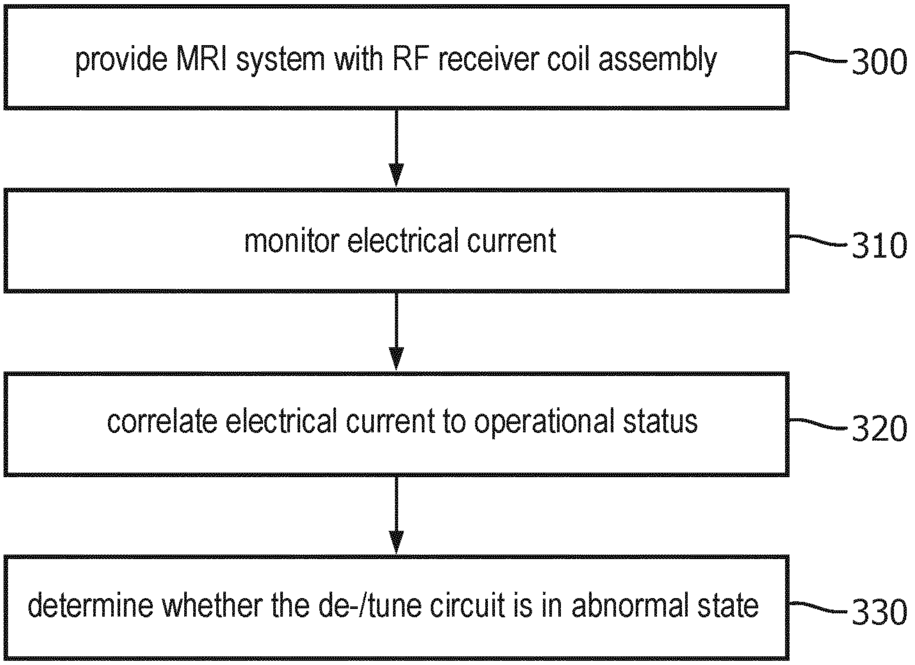
FIG. 3 shows a flowchart of a method for detecting an error of a magnetic resonance examination system in accordance with an embodiment of the invention.

FIG. 3 shows a flowchart of a method for detecting an error of a magnetic resonance examination system in accordance with an embodiment of the invention. In step 300, a MRI system is provided, the MRI system comprising a tunable radio frequency RF receiver coil assembly the tunable RF receiver coil assembly comprising, at least one RF receiver coil 1, an electronic de-/tune circuit 2 for switching between a low noise reception state of the tunable RF receiver coil 1 and a passive state of the tunable RF receiver coil 1, a monitor circuit 7, wherein the monitor circuit 7 is electrically insulated from and reactively coupled to the electronic de-/tune circuit 2, the monitor circuit 7 being adapted to inductively measure the AC electrical current or AC voltage in the electronic de-/tune circuit 2 induced by a RF transmit signal generated by the magnetic resonance examination system, a correlator device 10, wherein the correlator device 10 is arranged to correlate the inductively measured electrical current in the electronic de-/tune circuit 2 to the RF transmit operational status of a RF transmit pulse envelope for the RF transmit signal generated by the magnetic resonance examination system.

In step 310 the electrical current in the electronic de-/tune circuit 2 induced by a RF transmit signal generated by the magnetic resonance examination system is monitored by the monitor circuit 7.

In step 320 the inductively measured electrical current in the electronic de-/tune circuit 2 is correlated to the RF transmit operational status of a RF transmit pulse envelope for the RF transmit signal generated by the magnetic resonance examination system with the correlator device 10.

In step 330 it is determined whether the electronic de-/tune circuit 2 is in abnormal state based on the RF transmit operational status of a RF transmit pulse envelope for the RF transmit signal.

Figure 4:
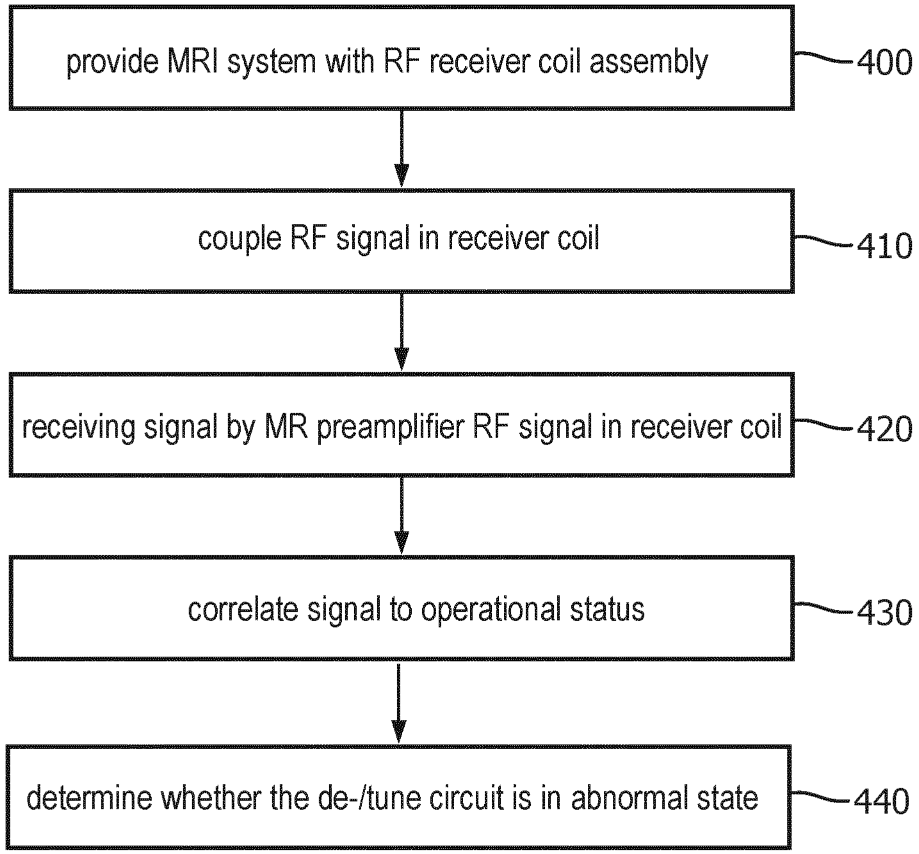
FIG. 4 shows a flowchart of a method for detecting an error of a magnetic resonance examination system in accordance with another embodiment of the invention.

FIG. 4 shows a flowchart of a method for detecting an error of a magnetic resonance examination system in accordance with another embodiment of the invention.

In step 400, a MRI system is provided, the MRI system comprising a tunable radio frequency RF receiver coil assembly the tunable RF receiver coil assembly comprising, at least one RF receiver coil 1 an electronic de-/tune circuit 2 for switching between a low noise reception state of the tunable RF receiver coil 1 and a passive state of the tunable RF receiver coil 1, a monitor circuit 7, wherein the monitor circuit 7 is electrically insulated from and reactively coupled to the electronic de-/tune circuit 2, the monitor circuit 7 being adapted to couple an RF signal into the tunable RF receiver coil 1 wherein the tunable RF receiver coil 1 is arranged to receive the coupled RF signal by a magnetic resonance MR preamplifier 12, a correlator device 10, the correlator device 10 is arranged to correlate the coupled RF signal received by the magnetic resonance preamplifier 12 to the RF transmit operational status of a RF transmit pulse envelope for the RF transmit signal generated by the magnetic resonance examination system.

In step 410 an RF signal is coupled into the tunable RF receiver coil 1 by the monitor circuit 7.

In step 420 the RF signal is received by the MR preamplifier 12.

In step 430 the received RF signal in the MR preamplifier 12 is correlated to the RF transmit operational status of a RF transmit pulse envelope for the RF transmit signal generated by the magnetic resonance examination system with the correlator device 10.

In step 440 it is determined whether the electronic de-/tune circuit 2 is in abnormal state.

In an embodiment the monitor circuit 7 is configured as transceiver and being adapted to couple an RF signal into the tunable RF receiver coil 1 and to measure a reflection coefficient of the RF signal coupled into the tunable RF receiver coil 1. This practically represents a third possibility, namely a mixture of the method explained in FIG. 3 and the method explained in FIG. 4. Based on a measurement of the reflection coefficient, a simple binary decision can be made whether the RF receiver coil 1 is still working or not.

While the invention has been illustrated and described in detail in the drawings and foregoing description, such illustration and description are to be considered illustrative or exemplary and not restrictive: the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST

| | |
|---|---|
| tunable radio frequency (RF) receiver coil | 1 |
| electronic de-/tune circuit | 2 |
| tank circuit | 3 |
| capacitor | 4 |
| inductance | 5 |
| switch | 6 |
| monitor circuit | 7 |
| inductance | 8 |
| bias | 9 |
| correlator device | 10 |
| data line | 11 |
| magnetic resonance preamplifier | 12 |
| data line | 13 |

The invention claimed is:

1. A tunable radio frequency RF receiver coil assembly for use in a magnetic resonance examination system the tunable RF receiver coil assembly comprising, at least one RF receiver coil, an electronic de-/tune circuit for switching between a low noise reception state of the tunable RF receiver coil and a passive state of the tunable RF receiver coil, a monitor circuit, wherein the monitor circuit (7) is electrically insulated from and reactively coupled to the electronic de-/tune circuit, the monitor circuit being adapted to inductively measure the AC electrical current or AC voltage in the electronic de-/tune circuit induced by a RF transmit signal generated by the magnetic resonance examination system or the monitor circuit is configured as transceiver and being adapted to couple an RF signal into the tunable RF receiver coil and to measure a reflection coefficient of the RF signal coupled into the tunable RF receiver coil, the RF receiver coil assembly further comprising a correlator device, wherein the correlator device is connected to the monitor circuit and is arranged to correlate the inductively measured electrical current in the electronic de-/tune circuit to the RF transmit operational status of an RF transmit pulse envelope for the RF transmit signal generated by the magnetic resonance examination system.

2. The tunable radio frequency RF receiver coil assembly according to the preceding claim, wherein the electronic de-/tune circuit-comprises a tank circuit with at least a first inductance, the monitor circuit-comprising at least a second inductance, wherein the monitor circuitis arranged to weakly couple with the second inductance to the first inductance for picking up a fraction of the current induced by the RF transmit signal wherein the monitor circuitis further arranged to produce a signal in dependence on the RF transmit signal or the monitor circuitis arranged to weakly couple with the second inductance to the tunable RF receiver coilfor coupling the RF signal into the tunable RF receiver coil.

3. The tunable radio frequency RF receiver coil assembly according to claim 1, wherein the monitor circuit further comprising a detector device, wherein the detector device is arranged to rectify or directly sample the signal dependent from the RF transmit signal.

4. The tunable radio frequency RF receiver coil assembly according to claim 3, wherein the detector device is part of a control logic of the tunable RF receiver coil.

5. The tunable radio frequency RF receiver coil assembly according to claim 3, wherein the detector device is integrated into the magnetic resonance preamplifier of the tunable radio frequency RF receiver coil.

6. The tunable radio frequency RF receiver coil assembly according to claim 1, wherein the electronic de-/tune circuit comprises at least one switch for switching between the low noise reception state of the tunable RF receiver coil and the passive state of the tunable RF receiver coil, wherein the switch is a field-effect transistor and/or MEMS switch.

7. The tunable radio frequency RF receiver coil assembly according to claim 1, wherein the correlator device is further configured to distinguish between different signal levels, wherein the different signal levels describe the respective functional state of at least one of the electronic de-/tune circuits.

8. A magnetic resonance examination system, the system comprising a tunable radio frequency RF receiver coil assembly according to claim 1.

9. The method according to claim 8, wherein the method comprises the following additional step:

mapping a position of the tunable RF receiver coil based on the monitored electrical current in the electronic de-/tune circuit.

10. A method for detecting an error of a magnetic resonance examination system the magnetic resonance examination system comprising a tunable radio frequency RF receiver coil assembly the tunable RF receiver coil assembly comprising, at least one RF receiver coil, an electronic de-/tune circuitfor switching between a low noise reception state of the tunable RF receiver coil and a passive state of the tunable RF receiver coil, a monitor circuit, wherein the monitor circuit is electrically insulated from and reactively coupled to the electronic de-/tune circuit, the monitor circuit being adapted to inductively measure the AC electrical current or AC voltage in the electronic de-/tune circuit-induced by an RF transmit signal generated by the magnetic resonance examination system, a correlator device, wherein the correlator device is arranged to correlate the inductively measured electrical current in the electronic de-/tune circuit to the RF transmit operational status of a RF transmit pulse envelope for the RF transmit signal generated by the magnetic resonance examination system, the method comprising the following steps:

monitoring the electrical current in the electronic de-/tune circuit induced by a RF transmit signal generated by the magnetic resonance examination system by the monitor circuit, correlating the inductively measured electrical current in the electronic de-/tune circuit to the RF transmit operational status of a RF transmit pulse envelope for the RF transmit signal generated by the magnetic resonance examination system with the correlator device, determining whether the electronic de-/tune circuit is in abnormal state based on the RF transmit operational status of a RF transmit pulse envelope for the RF transmit signal.

11. The method according to claim 10, wherein the step of mapping a position of the tunable RF receiver coil comprises the step of using deterministic matrix operations or AI techniques.

12. A computer program product comprising instructions stored on a non-transitory computer readable medium for detecting an error of a magnetic resonance examination system by controlling a tunable radio frequency RF receiver coil assembly according-to the method of claim 10.

13. A method for detecting an error of a magnetic resonance examination system the magnetic resonance examination system comprising a tunable radio frequency RF receiver coil assembly the tunable RF receiver coil assembly comprising, at least one RF receiver coil, an electronic de-/tune circuitfor switching between a low noise reception state of the tunable RF receiver coil and a passive state of the tunable RF receiver coil, a monitor circuit, wherein the monitor circuit is electrically insulated from and reactively coupled to the electronic de-/tune circuit, the monitor circuit being adapted to couple an RF signal into the tunable RF receiver coil wherein the tunable RF receiver coil is arranged to receive the coupled RF signal by a magnetic resonance MR preamplifier, the tunable RF receiver coil assembly further comprising a correlator device, wherein the correlator device is arranged to correlate the coupled RF signal received by the magnetic resonance preamplifier to the RF transmit operational status of a RF transmit pulse envelope for the RF transmit signal generated by the magnetic resonance examination system the method comprising the following steps:

coupling an RF signal into the tunable RF receiver coil by the monitor circuit, receiving the RF signal by the MR preamplifier, correlating the received RF signal in the MR preamplifier to the RF transmit operational status of a RF transmit pulse envelope for the RF transmit signal generated by the magnetic resonance examination system with the correlator device, determining whether the electronic de-/tune circuit is in abnormal state.

14. The method according to claim 13, wherein the step of coupling an RF signal into the tunable RF receiver coil by the monitor circuit is interleaved with a magnetic resonance sequence.

15. The method according to claim 14, wherein the step of coupling an RF signal into the tunable RF receiver coil by the monitor circuit is interleaved with a magnetic resonance sequence is combined with a pilot tone technique using an RF signal close to the Larmor frequency.

16. A computer program product comprising instructions stored on a non-transitory computer readable medium for detecting an error of a magnetic resonance examination system by controlling a tunable radio frequency RF receiver coil assembly according to the method of claim 13.

* * * * *